US012689000B2

(12) United States Patent
Lee et al.

(10) Patent No.: US 12,689,000 B2
(45) Date of Patent: Jul. 21, 2026

(54) SUBSTRATE PROCESSING APPARATUS

(71) Applicant: SEMES CO., LTD., Cheonan-si (KR)

(72) Inventors: Sangjeong Lee, Hwaseong-si (KR); Youngun Bong, Suwon-si (KR); Yoonseok Choi, Suwon-si (KR); Jaewon Shin, Suwon-si (KR); Hanlim Kang, Seoul (KR); Jongwon Park, Hwaseong-si (KR); Hyunwoo Jo, Hwaseong-si (KR); Kyunghun Jang, Jeonju-si (KR)

(73) Assignee: Semes Co., Ltd., Cheonan-si (KR)

( * ) Notice: Subject to any disclaimer, the term of this patent is extended or adjusted under 35 U.S.C. 154(b) by 479 days.

(21) Appl. No.: 18/310,740

(22) Filed: May 2, 2023

(65) Prior Publication Data

US 2023/0369018 A1     Nov. 16, 2023

(30) Foreign Application Priority Data

May 13, 2022     (KR) ........................ 10-2022-0059029

(51) Int. Cl.
*H01J 37/32*          (2006.01)
(52) U.S. Cl.
CPC ..... *H01J 37/32119* (2013.01); *H01J 37/3244* (2013.01); *H01J 37/32091* (2013.01)
(58) Field of Classification Search
CPC ........... H01J 37/32174; H01J 37/32091; H01J 37/3244; H01J 37/32119
See application file for complete search history.

(56) References Cited

U.S. PATENT DOCUMENTS

| | | | |
|---|---|---|---|
| 6,251,793 | B1 | 6/2001 | Wicker et al. |
| 8,608,903 | B2 | 12/2013 | Yamazawa et al. |
| 10,224,212 | B2 | 3/2019 | Kim et al. |
| 10,283,330 | B2 | 5/2019 | Marakhtanov et al. |

(Continued)

FOREIGN PATENT DOCUMENTS

| | | |
|---|---|---|
| KR | 10-2000-0016386 A | 3/2000 |
| KR | 10-2002-0081240 A | 10/2002 |

(Continued)

OTHER PUBLICATIONS

Notice of Allowance for Korean Application No. 10-2022-0059029 dated Dec. 21, 2023.

(Continued)

*Primary Examiner* — Patrick C Chen
(74) *Attorney, Agent, or Firm* — Harness, Dickey & Pierce, P.L.C.

(57)          ABSTRACT

There is provided a substrate processing apparatus including a chamber having a processing space therein, a dielectric window arranged at an upper portion of the chamber and configured to cover an upper surface of the chamber, and an RF source disposed on the dielectric window and configured to supply RF power to generate plasma from gas in the processing space, wherein the RF source includes an RF electrode disposed on the dielectric window and an RF plate disposed on the RF electrode, the dielectric window includes a groove extending vertically downward from an uppermost surface of the dielectric window, and the RF plate has a ring shape.

14 Claims, 6 Drawing Sheets

(56) References Cited

U.S. PATENT DOCUMENTS

| | | | |
|---|---|---|---|
| 2007/0044915 A1* | 3/2007 | Ni | C23F 4/00 |
| | | | 118/723 MA |
| 2009/0065486 A1 | 3/2009 | Yamashita | |
| 2013/0084404 A1* | 4/2013 | Park | H05K 3/125 |
| | | | 118/620 |
| 2013/0292055 A1 | 11/2013 | Setton et al. | |
| 2016/0118229 A1* | 4/2016 | Iwai | H01J 37/321 |
| | | | 156/345.48 |
| 2016/0118284 A1 | 4/2016 | Iwai et al. | |
| 2016/0276230 A1* | 9/2016 | Nagorny | H01L 21/3065 |
| 2022/0013328 A1 | 1/2022 | Kim et al. | |

FOREIGN PATENT DOCUMENTS

| | | | |
|---|---|---|---|
| KR | 10-2008-0098386 A | 11/2008 | |
| KR | 10-2011-0046353 A | 5/2011 | |
| KR | 10-2015-0051109 A | 5/2015 | |
| KR | 10-2015-0051192 A | 5/2015 | |
| KR | 10-2015-0077115 A | 7/2015 | |
| KR | 10-2016-0110904 A | 9/2016 | |
| KR | 10-2018-0011711 A | 2/2018 | |
| KR | 10-2018-0072916 A | 7/2018 | |
| KR | 10-2018-0097475 A | 8/2018 | |
| KR | 10-2018-0130068 A | 12/2018 | |
| KR | 10-2019-0104067 A | 9/2019 | |
| KR | 10-2020-0031198 A | 3/2020 | |
| KR | 10-2021-0061269 A | 5/2021 | |
| KR | 10-2022-0007269 A | 1/2022 | |
| KR | 10-2022-0021745 A | 2/2022 | |
| KR | 10-2022-0058777 A | 5/2022 | |
| TW | 376531 B | 12/1999 | |
| TW | 518914 B | 1/2003 | |
| WO | 2008093389 A1 | 8/2008 | |

OTHER PUBLICATIONS

Taiwan Office Action issued Oct. 17, 2025 in Taiwan Patent Application No. 112116041.

* cited by examiner

SUBSTRATE PROCESSING APPARATUS

CROSS-REFERENCE TO RELATED APPLICATION

This application is based on and claims priority under 35 U.S.C. § 119 to Korean Patent Application No. 10-2022-0059029, filed on May 13, 2022, in the Korean Intellectual Property Office, the disclosure of which is incorporated by reference herein in its entirety.

BACKGROUND

1. Field

The disclosure relates to a substrate processing apparatus, and more particularly, to a substrate processing apparatus using plasma.

2. Description of the Related Art

A plasma generator includes a plasma enhanced chemical vapor deposition (PECVD) apparatus for thin film deposition, an etching apparatus for etching and patterning deposited thin films, a sputter, and an ashing apparatus.

In addition, plasma generators are classified into capacitively coupled plasma (CCP) apparatuses and inductively coupled plasma (ICP) apparatuses according to a method of applying RF power. A CCP apparatus generates plasma using an RF electric field formed vertically between electrodes by applying RF power to parallel plates and the electrodes facing each other. An ICP apparatus converts a source material into plasma using an induced electric field generated by an antenna.

SUMMARY

There is provided a substrate processing apparatus having a structure with electrically and mechanically increased stability.

Additional aspects will be set forth in part in the description which follows and, in part, will be apparent from the description, or may be learned by practice of the presented embodiments of the disclosure.

According to an aspect of the disclosure, there is provided a substrate processing apparatus including a chamber having a processing space therein, a dielectric window arranged at an upper portion of the chamber and configured to cover an upper surface of the chamber, and an RF source disposed on the dielectric window and configured to supply RF power to generate plasma from gas in the processing space, wherein the RF source includes an RF electrode disposed on the dielectric window and an RF plate disposed on the RF electrode, the dielectric window includes a groove extending vertically downward from an uppermost surface of the dielectric window, and the RF plate has a ring shape.

In some embodiments, a protrusion portion of the RF plate is engaged with the groove.

In some embodiments, an uppermost surface of the dielectric window is arranged at a same vertical level as a vertical level of a lower surface of the RF electrode, and is arranged at a vertical level greater than a vertical level of a lowermost surface of the RF plate.

In some embodiments, each of side surfaces of the RF plate is not aligned with side surfaces of the groove in a vertical direction, and is located inside each of the side surfaces of the groove in a horizontal direction.

In some embodiments, the RF electrode includes an optically transparent material.

According to another aspect of the disclosure, there is provided a substrate processing apparatus including a chamber having a processing space therein, a dielectric window arranged at an upper portion of the chamber and configured to cover an upper surface of the chamber, and an RF source disposed on the dielectric window and configured to supply RF power to generate plasma from gas in the processing space, wherein the RF source includes an RF power source configured to generate the RF power, an RF electrode disposed on the dielectric window, and an RF plate disposed on the RF electrode, the RF plate includes a trench extending vertically upward from a surface where the RF plate and the RF electrode are in contact with each other, and a gasket arranged inside the trench, the dielectric window includes a groove extending vertically downward from an uppermost surface of the dielectric window, a protrusion portion of the RF plate is engaged with the groove, the RF electrode includes an optically transparent material, and the RF plate has a ring shape.

In some embodiments, an uppermost surface of the gasket is in direct contact with an uppermost surface of an uneven surface of the RF plate, and a lowermost surface of the gasket is in direct contact with a upper surface of the RF electrode.

In some embodiments, an upper surface of the RF electrode is in contact with a lower surface of the trench, and a lower surface of the RF electrode is in contact with the upper surface of the dielectric window.

In some embodiments, the RF plate includes a hole and further includes a coupling unit arranged inside the hole to fix the RF plate and the dielectric window together.

In some embodiments, a lower surface of the coupling unit is arranged at a vertical level less than a vertical level of a lowermost surface of the RF plate, and in a plan view, the coupling unit is arranged inside the groove.

In some embodiments, the coupling unit includes a non-conductive material for electrical insulation of the dielectric window.

In some embodiments, the gasket includes a conductive material for electrical connection between the RF electrode and the RF plate.

In some embodiments, the gasket is elastically compressed.

In some embodiments, a major axis of a vertical cross-section of the gasket is parallel to a horizontal direction, and a minor axis of a vertical cross-section of the gasket is parallel to a vertical direction.

According to another aspect of the disclosure, there is provided a substrate processing apparatus including a chamber having a processing space therein, a support unit arranged at a lower portion of the chamber and configured to support a substrate, a gas supply unit configured to supply gas into the processing space, a dielectric window arranged at an upper portion of the chamber and configured to cover an upper surface of the chamber, and an RF source disposed on the dielectric window and configured to supply RF power to generate plasma from gas in the processing space, wherein the RF source includes an RF power source configured to generate the RF power, an RF rod configured to transmit the RF power, an RF electrode disposed on the dielectric window, and an RF plate disposed on the RF electrode, the dielectric window includes a groove extending vertically downward from an uppermost surface of the dielectric window, the RF plate includes a hole and further includes a coupling unit arranged inside the hole to fix the RF plate and the dielectric window together, the RF plate further includes a trench extending vertically upward from a surface where the RF plate and the RF electrode are in contact with each other, and a gasket arranged inside the trench, a protrusion portion of the RF plate is engaged with an inner side surface of the groove, the RF electrode includes an optically transparent material, and the RF plate has a ring shape having an inner diameter and an outer diameter.

In some embodiments, the RF electrode has a thickness of about 0.1 micrometer to about 1 micrometer.

In some embodiments, the groove has a thickness of about 1 micrometer to about 5 micrometer.

In some embodiments, a center of the RF electrode, a center of the RF plate, and a center of the substrate are aligned in a vertical direction, and each of a diameter of the RF electrode and the inner diameter of the RF plate is greater than a diameter of the substrate.

In some embodiments, a diameter of the RF electrode is greater than the inner diameter of the RF plate, and is less than the outer diameter of the RF plate.

In some embodiments, the RF electrode includes at least one of indium tin oxide (ITO), indium zinc oxide (IZO), tin oxide ($SnO_2$) and zinc oxide (ZnO).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
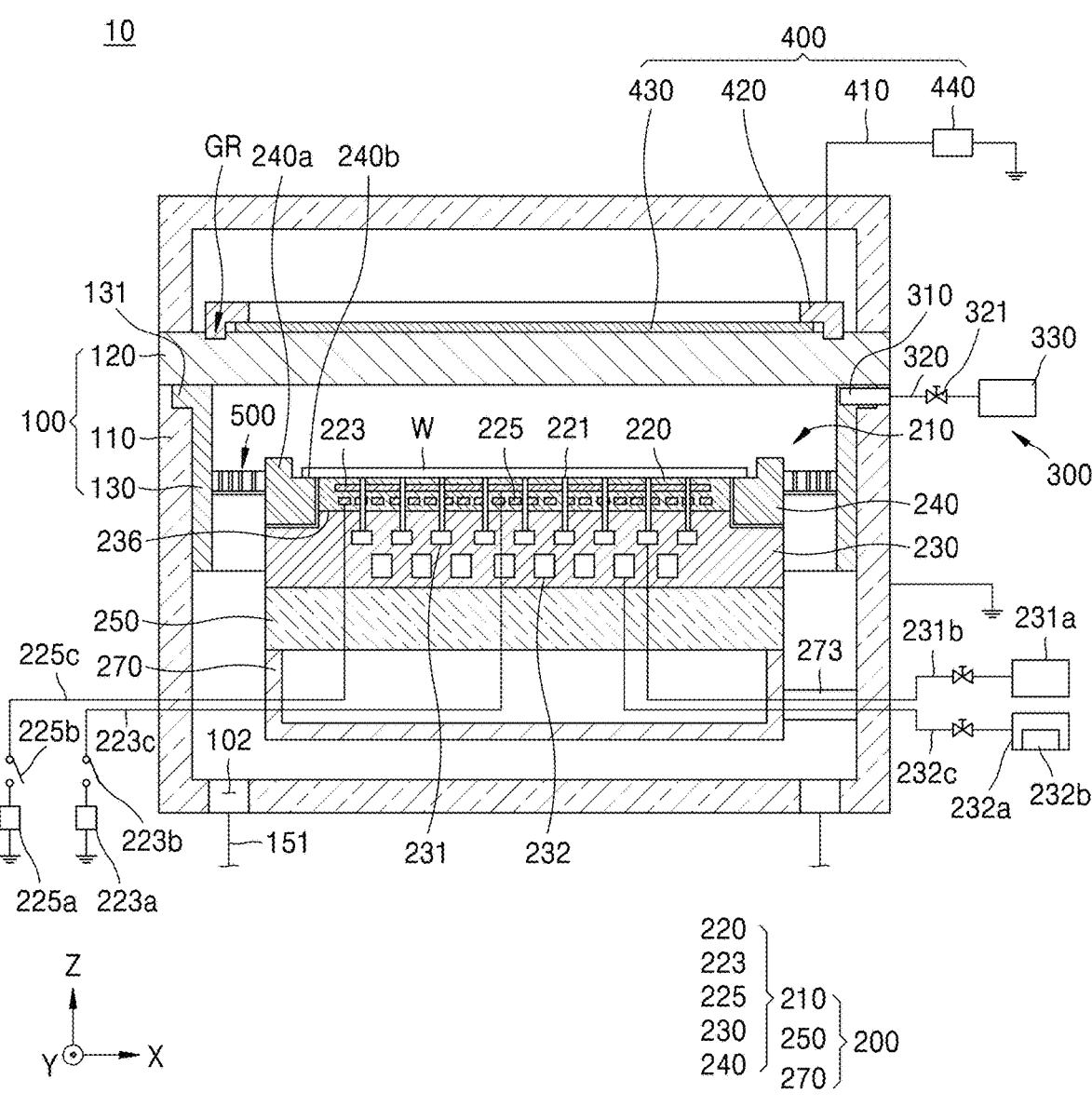
FIG. 1 is a cross-sectional view of a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The advantages and features of the present embodiments and a method to achieve the same will be clearer referring to the detailed descriptions below with the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to one of ordinary skill in the art, and the disclosure is only defined by the scope of the claims. Throughout the specification, identical reference numerals refer to identical components.

It will be understood that when an element or a layer is referred to as being "on" another element or another layer, the element or the layer can be directly on another element or another layer, or an intervening layer or an intervening element may be present thereon. In contrast, when an element is referred to as being "directly on" a component, an intervening element or an intervening layer is not present thereon.

Spatially relative terms, such as "below," "beneath," "lower," "above," and "upper," may be used herein to easily describe the correlation between one element or components and other elements or component as illustrated in the drawings. It will be understood that the spatially relative terms are intended to encompass different orientations of an element in use or operation in addition to the orientation illustrated in the drawings. For example, when an element illustrated in the drawings is turned over, elements described as being "below" or "beneath" other elements may then be "above" the other elements. Therefore, the exemplary term "below" may encompass directions of both below and above. An element may also be oriented in another direction, and thus, the spatially relative terms may be interpreted differently depending on the orientation.

It will be understood that, although the terms first, second, and other terms may be used herein to describe various elements, various components, and/or various sections, these elements, components, and/or sections should not be limited by these terms. These terms are only used to distinguish one element, component, or section from another element, component, or section. Therefore, a first element, a first component, or a first section described in the following description may be a second element, a second component, or a second section within the inventive concept of the disclosure.

The terms used herein are for describing embodiments and are not intended to limit the disclosure. Throughout the specification, the singular forms "a," "an" and "the" are intended to include the plural forms as well, unless the context clearly indicates otherwise. It will be further understood that the terms "comprises" and/or "comprising" used herein specify the presence of stated components, steps, operations, and/or elements, but do not preclude the presence or addition of one or more other components, steps, operations, and/or elements.

Unless otherwise defined, all terms (including technical and scientific terms) used herein may be used in a sense commonly understood by those skilled in the art. In addition, terms defined in commonly used dictionaries are not interpreted ideally or excessively unless explicitly specifically defined.

Hereinafter, embodiments will be described in detail with reference to the accompanying drawings, and in the description with reference to the accompanying drawings, the same or corresponding components regardless of reference numerals are given the same reference numerals, and redundant descriptions thereof will be omitted.

In the present embodiment, a wafer is taken as an example of an object to be plasma-processed, and a plasma processing apparatus using a capacitively coupled plasma is taken as an example of a plasma source. However, the disclosure is not limited thereto, and the object may be another type of substrate, such as a glass substrate.

Figure 2:
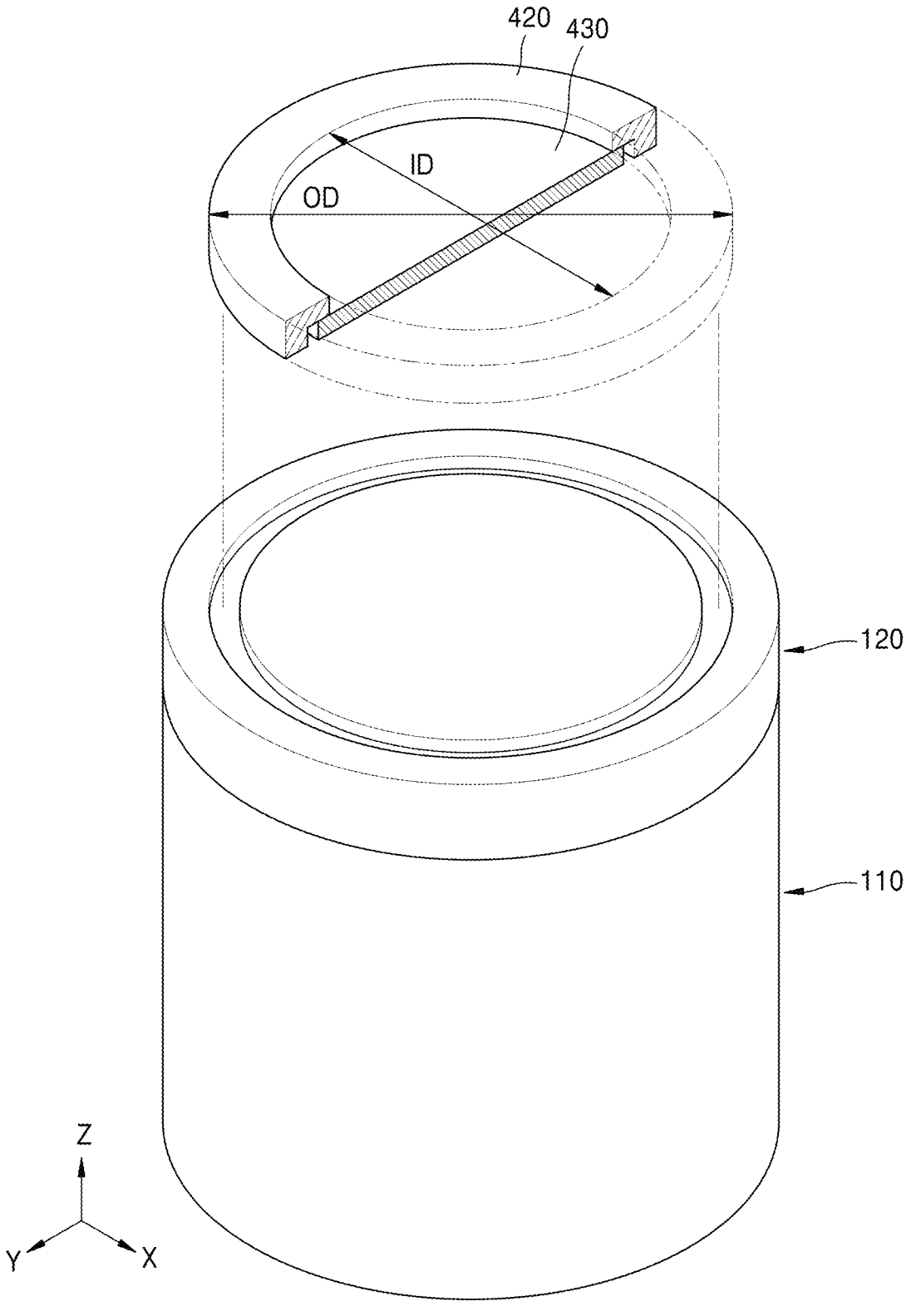
FIG. 2 is a perspective view of a substrate processing apparatus according to an embodiment.

FIG. 1 is a cross-sectional view of a substrate processing apparatus according to an embodiment. FIG. 2 is a perspective view of a substrate processing apparatus according to an embodiment.

Referring to FIGS. 1 and 2, a substrate processing apparatus 10 processes a substrate W using plasma. For example, the substrate processing apparatus 10 may perform an etching process to the substrate W. The substrate processing apparatus 10 includes a chamber 100, a support unit 200, a gas supply unit 300, a radio-frequency (RF) source 400, and a baffle unit 500.

The chamber 100 provides a space on which a substrate processing process is performed. The chamber 100 includes a housing 110, a dielectric window 120, and a liner 130.

The housing 110 has therein a space which is open through an upper surface of the housing 110. The inner space of the housing 110 is provided as a space in which a substrate processing process is performed. The housing 110 includes a metal material. For example, the housing 110 may include an aluminum material. The housing 110 may be grounded. An exhaust hole 102 is formed in a bottom surface of the housing 110. The exhaust hole 102 is connected to an exhaust line 151. A reaction byproduct generated during a process and gas remaining in the inner space of the housing 110 may be discharged to the outside through the exhaust line 151. A pressure inside the housing 110 is reduced to a certain pressure by an exhaust process.

The dielectric window 120 covers the open upper surface of the housing 110. The dielectric window 120 is provided in a plate shape and seals the inner space of the housing 110. The dielectric window 120 may be provided to be separable. In other words, the dielectric window 120 may correspond to an upper wall of the chamber 100.

The dielectric window 120 may include a ceramic insulator, such as quartz glass or aluminum nitride. An electrode plate may be disposed above the dielectric window 120. The dielectric window 120 may have a diameter equal to that of the housing 110.

An RF plate 420 and the RF electrode 430 may be disposed on the dielectric window 120, which will be described in the following description.

The dielectric window 120 may include a groove GR in which the RF plate 420 may be arranged. The groove GR may have a concave shape extending vertically downward from an uppermost surface of the dielectric window 120. A protrusion portion of the RF plate 420 may be engaged with the groove GR. A protrusion portion of the RF plate 420 may be engaged with an inner surface of the groove GR. In other words, the uppermost surface of the dielectric window 120 may be arranged at a vertical level greater than that of a lowermost surface of the RF plate 420. The groove GR may be provided along a circumferential direction of the dielectric window 120.

In this regard, a horizontal direction (X direction and/or Y direction) refers to a direction parallel to an extension direction of a main surface of the chamber 100, and a vertical direction (Z direction) refers to a direction parallel to a height direction of the chamber 100.

The liner 130 is provided inside the housing 110. The liner 130 has formed therein a space which is open through an upper surface and lower surface of the liner 130. For example, the liner 130 may be provided in a cylindrical shape. The liner 130 may have a radius corresponding to an inside surface of the housing 110. The liner 130 is provided along the inside surface of the housing 110. A support ring 131 is formed on an upper end of the liner 130. The support ring 131 is provided as a ring-shaped plate and protrudes outward from the liner 130 along a circumference of the liner 130. The support ring 131 is placed on an upper end of the housing 110 and supports the liner 130. The liner 130 may include a material identical to that of the housing 110. For example, the liner 130 may include an aluminum material. The liner 130 protects the inside surface of the housing 110. During excitation of a process gas, an arc discharge may occur inside the chamber 100. The arc discharge causes damage to neighboring apparatuses. The liner 130 prevents the inside surface of the housing 110 from being damaged by an arch discharge, by protecting the inside surface of the housing 110. In addition, the liner 130 prevents impurities generated during a substrate processing process from being deposited on an inside wall of the housing 110. The liner 130 is cheaper than the housing 110 and is easy to replace. Therefore, when the liner 130 is damaged by arc discharge, an operator may replace the liner 130 with a new liner 130.

The support unit 200 is located inside the housing 110. The support unit 200 supports the substrate W. The support unit 200 may include an electrostatic chuck 210 that adsorbs the substrate W using an electrostatic force. Alternatively, the support unit 200 may support the substrate W in various ways such as mechanical clamping. Hereinafter, the support unit 200 including the electrostatic chuck 210 will be described.

The support unit 200 includes the electrostatic chuck 210, an insulating plate 250, and a lower cover 270. The support unit 200 is located inside the chamber 100 to be spaced apart from the bottom surface of the housing 110 in an upward direction.

The electrostatic chuck 210 includes a support plate 220, a lower electrode 223, a heater 225, a base plate 230, and a focus ring 240.

The support plate 220 is located at an upper end portion of the electrostatic chuck 210. The support plate 220 may include a disk-shaped dielectric material. The substrate W is placed on an upper surface of the support plate 220. The upper surface of the support plate 220 has a radius less than that of the substrate W. Therefore, an edge area of the substrate W is located outside the support plate 220.

A supply flow path 221 is formed in the support plate 220. The supply flow path 221 is provided from an upper surface of the electrostatic chuck 210 to a lower surface thereof. The supply flow path 221 includes a plurality of supply flow paths 221 that are apart from each other, and is provided as a passage through which a heat transfer medium is supplied to a lower surface of the substrate W.

The lower electrode 223 and the heater 225 are buried inside the support plate 220. The lower electrode 223 is disposed above the heater 225. The lower electrode 223 is electrically connected to a first lower power source 223a. The first lower power source 223a includes a direct current power source. A switch 223b is installed between the lower electrode 223 and the first lower power source 223a. The lower electrode 223 may be electrically connected to the first lower power source 223a by turning on/off the switch 223b. When the switch 223b is turned on, direct current is applied to the lower electrode 223. An electrostatic force is applied between the lower electrode 223 and the substrate W by the current applied to the lower electrode 223, and the substrate W is adsorbed to the support plate 220 by the electrostatic force.

The heater 225 is electrically connected to a second lower power source 225a. The heater 225 generates heat by resisting current applied from the second lower power source 225a. The generated heat is transferred to the substrate W through the support plate 220. The substrate W is maintained at a certain temperature by the heat generated by the heater 225. The heater 225 includes a spiral-shape coil.

The base plate 230 is disposed below the support plate 220. A lower surface of the support plate 220 and an upper surface of the base plate 230 may be bonded to each other by an adhesive 236. The base plate 230 includes an aluminum material. The upper surface of the base plate 230 may have a step so that a center area is higher than an edge area. The center area of the upper surface of the base plate 230 has an area corresponding to the lower surface of the support plate 220, and is bonded to the lower surface of the support plate 220. The base plate 230 has a first circulation flow path 231, and a second circulation flow path 232 formed therein.

The first circulation flow path 231 is provided as a passage through which a heat transfer medium circulates. The first circulation flow path 231 may be formed in a spiral shape inside the base plate 230. Alternatively, the first circulation flow path 231 may be arranged in such a manner that ring-shaped flow paths having different radii have the same center. The first circulation flow paths 231 may communicate with each other. The first circulation flow paths 231 are formed at the same height.

The second circulation flow path 232 is provided as a passage through which a cooling fluid circulates. The second circulation flow path 232 may be formed in a spiral shape inside the base plate 230. In addition, the second circulation flow path 232 may be arranged in such a manner that ring-shaped flow paths having different radii have the same center. The second circulation flow paths 232 may communicate with each other. The second circulation flow path 232 have a cross-sectional area larger than that of the first circulation flow path 231. The second circulation flow paths 232 are formed at the same height. The second circulation flow path 232 may be disposed under the first circulation flow path 231.

The supply flow path 221 extends upward from the first circulation flow path 231, and is provided on the upper surface of the base plate 230. The supply flow path 221 may be connected to the first circulation flow path 231.

The first circulation flow path 231 is connected to a heat transfer medium storage unit 231a through a heat transfer medium supply line 231b. A heat transfer medium is stored in the heat transfer medium storage unit 231a. The heat transfer medium includes an inert gas. According to an embodiment, the heat transfer medium includes helium (He) gas. The helium gas is supplied to the first circulation flow path 231 through the heat transfer medium supply line 231b and is supplied to the lower surface of the substrate W through the supply flow path 221 sequentially. The helium gas acts as a medium through which heat transferred from plasma to the substrate W is transferred to the electrostatic chuck 210.

The second circulation flow path 232 is connected to a cooling fluid storage unit 232a through a cooling fluid supply line 232c. A cooling fluid is stored in the cooling fluid storage unit 232a. A cooler 232b may be provided in the cooling fluid storage unit 232a. The cooler 232b cools the cooling fluid to a certain temperature. Alternatively, the cooler 232b may be installed on the cooling fluid supply line 232c. A cooling fluid supplied to the second circulation flow path 232 through the cooling fluid supply line 232c circulates along the second circulation flow path 232 and cools the base plate 230. While the base plate 230 is cooled, the support plate 220 and the substrate W are cooled together to maintain the substrate W at a certain temperature.

The focus ring 240 is arranged at an edge area of the electrostatic chuck 210. The focus ring 240 has a ring shape and is arranged along a circumference of the support plate 220. An upper surface of the focus ring 240 may have a step so that an outside portion 240a is higher than an inside portion 240b. The inside portion 240b of the upper surface of the focus ring 240 is located at the same vertical level as that of the upper surface of the support plate 220. The inside portion 240b of the upper surface of the focus ring 240 supports the edge area of the substrate W located outside the support plate 220. The outside portion 240a of the focus ring 240 is provided to surround the edge area of the substrate W. The focus ring 240 allows plasma to be concentrated in an area facing the substrate W in the chamber 100.

The insulating plate 250 is disposed below the base plate 230. The insulating plate 250 has a cross-sectional area corresponding to the base plate 230. The insulating plate 250 is located between the base plate 230 and the lower cover 270. The insulating plate 250 includes an insulating material and electrically insulates the base plate 230 and the lower cover 270 from each other.

The lower cover 270 is located at a lower end portion of the support unit 200. The lower cover 270 is located apart from a bottom surface of the housing 110 upward. The lower cover 270 has formed therein a space which is open through an upper surface of the lower cover 270. The upper surface of the lower cover 270 is covered by the insulating plate 250. Therefore, an outer radius of a cross section of the lower cover 270 may be equal to an outer radius of the insulating plate 250. A lift pin module (not shown) for moving the substrate W to be transported from an external transport member to the electrostatic chuck 210 may be located in the inner space of the lower cover 270.

The lower cover 270 has a connection member 273. The connection member 273 connects an outside surface of the lower cover 270 and the inside wall of the housing 110 together. The connection member 273 may include a plurality of connection members 273 on the outside surface of the lower cover 270 at regular distance. The connection member 273 supports the support unit 200 inside the chamber 100. In addition, the connection member 273 is connected to the inside wall of the housing 110 so that the lower cover 270 is electrically grounded. A first power line 223c connected to the first lower power source 223a, a second power line 225c connected to the second lower power source 225a, the heat transfer medium supply line 231b connected to the heat transfer medium storage unit 231a, and the cooling fluid supply line 232c connected to the cooling fluid storage unit 232a extend into the lower cover 270 through an inner space of the connection member 273.

The gas supply unit 300 supplies process gas into the chamber 100. The gas supply unit 300 includes a gas supply nozzle 310, a gas supply line 320, and a gas storage unit 330. For example, the gas supply nozzle 310 may be arranged adjacent to a side surface of an upper portion of the housing 110. A spray hole is formed on one side surface of the gas supply nozzle 310. The spray hole is disposed under the dielectric window 120 and supplies process gas into the chamber 100. The gas supply line 320 connects the gas supply nozzle 310 and the gas storage unit 330 together. The gas supply line 320 supplies process gas stored in the gas storage unit 330 to the gas supply nozzle 310. A valve 321 is installed on the gas supply line 320. The valve 321 opens and closes the gas supply line 320 and controls a flow rate of process gas supplied through the gas supply line 320. As another example, the gas supply nozzle 310 may be provided along a rim at the upper end of the housing 110.

The RF source 400 excites process gas in the chamber 100 into a plasma state. A capacitively coupled plasma (CCP) source may be used as the RF source 400. The RF source 400 may include an RF rod 410, the RF plate 420, the RF electrode 430, and the RF power source 440.

The RF rod 410 may be configured to transmit RF power generated from the RF power source 440 to the RF plate 420 and/or the RF electrode 430.

The RF plate 420 supports the RF electrode 430 and may be configured to transmit RF power to the RF electrode 430. The RF plate 420 may be provided in a ring shape. In other words, the RF plate 420 may have an inner diameter ID and an outer diameter OD. The RF plate 420 may include a conductive material. For example, the RF plate 420 may include tin (Sn), silver (Ag), copper (Cu), and/or aluminum (Al).

The RF electrode 430 may receive RF power from the RF power source 440 and transmit the RF power into the chamber 100. The RF electrode 430 may be provided in a circular plate shape. For example, the RF electrode 430 may include an optically transparent material. The RF electrode 430 may include, for example, indium tin oxide (ITO), indium zinc oxide (IZO), tin oxide ($SnO_2$), and/or zinc oxide (ZnO).

When the RF electrode 430 includes an optically transparent material, a laser irradiated from an upper surface of the chamber 100 may reach the substrate W by passing through the RF electrode 430 and the dielectric window 120. Therefore, a diameter of the RF electrode 430 and/or the inner diameter ID of the RF plate 420 may be greater than a diameter of the substrate W. In addition, the diameter of the RF electrode 430 may be greater than the inner diameter ID of the RF plate 420, and the diameter of the RF electrode 430 may be less than the outer diameter OD of the RF plate 420. For example, a diameter of the RF electrode 430 and/or the inner diameter ID of the RF plate 420 may be greater than or equal to about 300 mm. In addition, a center of the substrate W, a center of the RF plate 420, and a center of the RF electrode 430 may be aligned in the vertical direction (Z direction).

According to an embodiment, a lower surface of the RF electrode 430 may be located at a substantially same vertical level as that of the uppermost surface of the dielectric window 120, and an upper surface of the RF electrode 430 may be located at the same vertical level as that of an uppermost surface of an uneven surface of the RF plate 420.

In addition, the lowermost surface of the RF plate 420 may be located at the same vertical level as that of an upper surface of the dielectric window 120 located at the lowest vertical level. In other words, the lowermost surface of the RF plate 420 may be located at a vertical level less than that of the uppermost surface of the dielectric window 120 and that of the lower surface of the RF electrode 430.

Since the lowermost surface of the RF plate 420 is located at a vertical level less than that of the lower surface of the RF electrode 430, the RF plate 420 may effectively cover the RF electrode 430. Therefore, reliability of the RF electrode 430 may increase.

In addition, each of side surfaces of the RF electrode 430 may not be aligned with each of side surfaces of grooves GR in the vertical direction (Z direction).

In addition, in a plan view, each of side surfaces of the RF electrode 430 may be located inside of side surfaces of the groove GR in a horizontal direction (X direction and/or Y direction). In other words, the side surfaces of the RF electrode 430 may not be in contact with the groove GR.

The RF electrode 430 may have a thickness of, for example, about 0.1 micrometer to about 1 micrometer. In addition, the groove GR may have a thickness of about 2 micrometer to about 5 micrometer. In order for the RF electrode 430 to be optically transparent, a thickness of the RF electrode 430 may be sufficiently thin.

The baffle unit 500 is located between the inside wall of the housing 110 and the support unit 200. The baffle unit 500 includes a body in which through holes are formed. The body of the baffle unit 500 is provided in a ring shape. Process gas provided in the housing 110 passes through the through holes of the baffle unit 500 and is exhausted through the exhaust hole 102. A flow of the process gas may be controlled according to a shape of the baffle unit 500 and a shape of through holes.

A general substrate processing apparatus includes an opaque RF electrode. Thus, when a laser is irradiated from an upper surface of the RF electrode, the laser may not pass efficiently through the RF electrode. In addition, since a dielectric window of a general substrate processing apparatus may not include a groove, mechanical coupling between the RF electrode and an RF plate is relatively weak.

On the other hand, the substrate processing apparatus 10 according to an embodiment includes an optically transparent RF electrode 430, so that when a laser is irradiated from the upper surface of the RF electrode 430, the laser may pass through the RF electrode 430. Thus, the laser may reach the substrate W.

In addition, the dielectric window 120 of the substrate processing apparatus 10 according to an embodiment includes the groove GR, so that mechanical coupling between the RF plate 420 and the RF electrode 430 may have relatively strong. Thus, the reliability of the substrate processing apparatus 10 may be improved.

Figure 3:
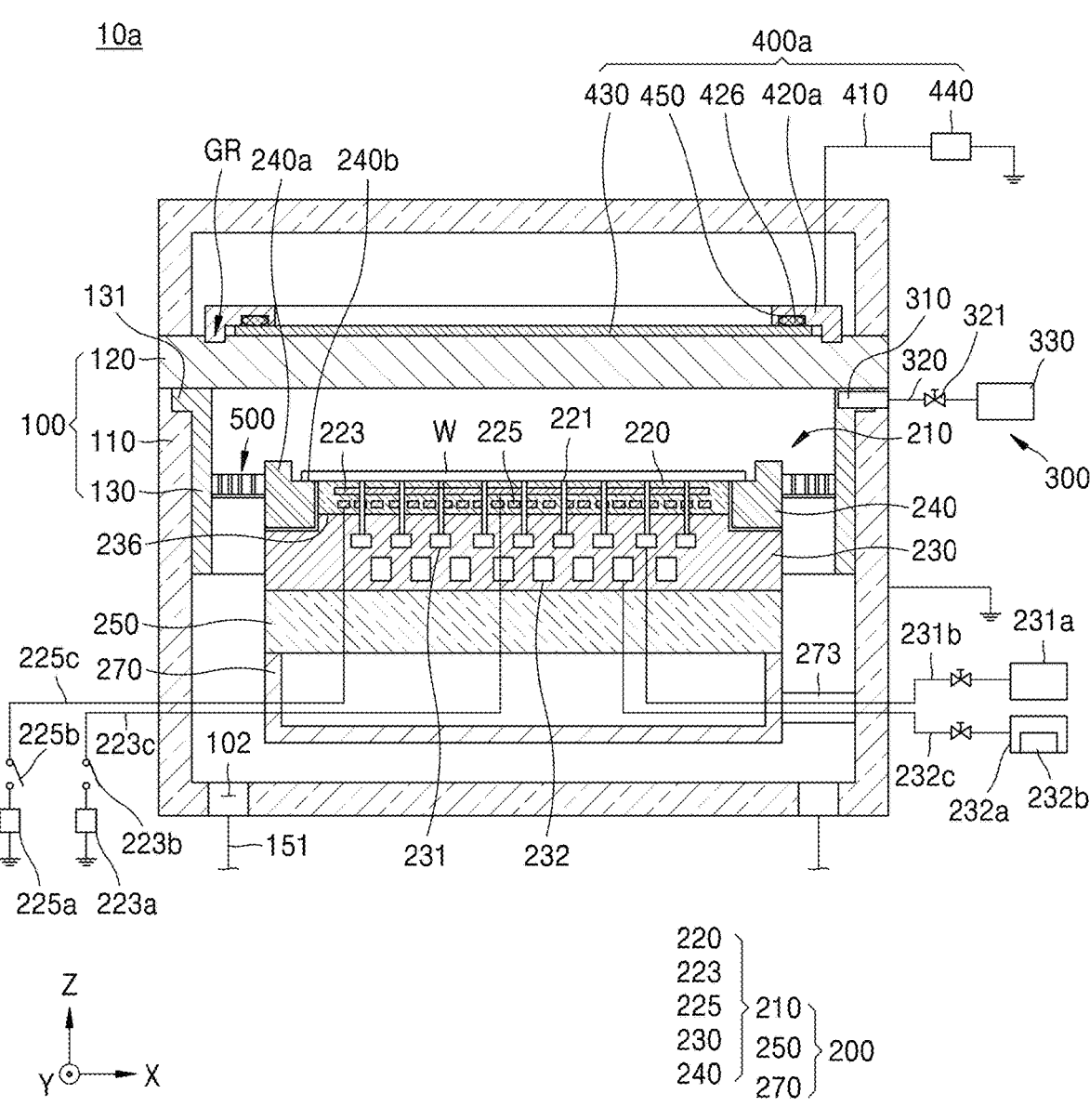
FIG. 3 is a cross-sectional view of a substrate processing apparatus according to an embodiment.
Figure 4:
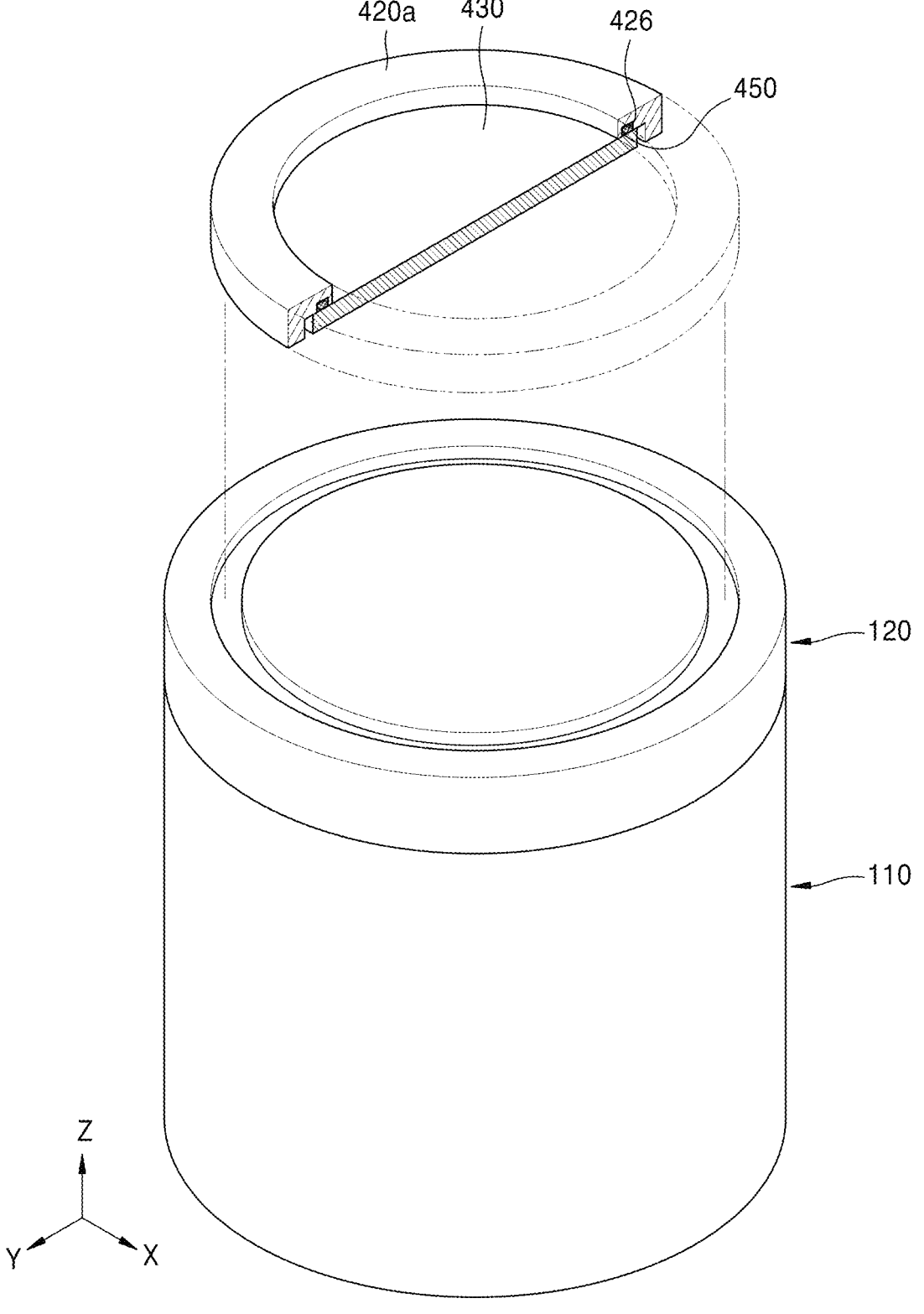
FIG. 4 is a perspective view of a substrate processing apparatus according to an embodiment.

FIG. 3 is a cross-sectional view of a substrate processing apparatus according to an embodiment. FIG. 4 is a perspective view of a substrate processing apparatus according to an embodiment.

Referring to FIGS. 3 and 4, a substrate processing apparatus 10a includes a chamber 100, the support unit 200, the gas supply unit 300, an RF source 400a, and the baffle unit 500. The chamber 100, the support unit 200, the gas supply unit 300, and the baffle unit 500 of FIG. 3 are substantially the same as the chamber 100, the support unit 200, the gas supply unit 300, and the baffle unit 500 of FIG. 1, respectively, and thus, only RF source 400a will be described in the following description.

An RF plate 420a may include a trench 426.

The trench 426 may be disposed on a surface where the RF plate 420a and the RF electrode 430 are in contact with each other. In other words, the trench 426 may be disposed on an uneaven surface of RF plate 420a.

The trench 426 may extend vertically upward from the surface where the RF plate 420a and the RF electrode 430 are in contact with each other inside the RF plate 420a.

The trench 426 may be provided along a circumferential direction of the RF plate 420a.

A gasket 450 may be arranged inside the trench 426.

The gasket 450 may include, for example, a conductive material.

For example, the gasket 450 may include a metal.

For example, the gasket 450 may include copper and/or beryllium.

When the gasket 450 includes a conductive material, electrical connectivity between the RF plate 420a and the RF electrode 430 may be improved.

In addition, since the gasket 450 is arranged inside the trench 426, a physical connectivity between the RF plate 420a and the RF electrode 430 may be improved.

In other words, the gasket 450 may be in direct contact with each of the RF electrode 430 and the RF plate 420a.

Therefore, the gasket 450 may buffer an assembly tolerance between the RF plate 420a and the RF electrode 430. According to an embodiment, a plurality of gaskets 450 may be provided.

According to an embodiment, a lower surface of the trench 426 and/or a lower surface of the gasket 450 may be in direct contact with an upper surface of the RF electrode 430.

In addition, an upper surface of the gasket 450 may be in direct contact with each of a lower surface of the RF plate 420a located at the highest vertical level and an upper surface of the trench 426.

The gasket 450 may be, for example, elastically compressed.

Therefore, when the RF electrode 430 is disposed on the RF plate 420a, the gasket 450 may be partially crushed and have an elliptical shape.

In other words, a vertical cross-section of the gasket 450 may have an elliptical shape.

The elliptical shape may have a shape in which an extension direction of the major axis is parallel to the horizontal direction (X direction and/or Y direction) and an extension direction of the minor axis is parallel to the vertical direction (Z direction).

Figure 5:
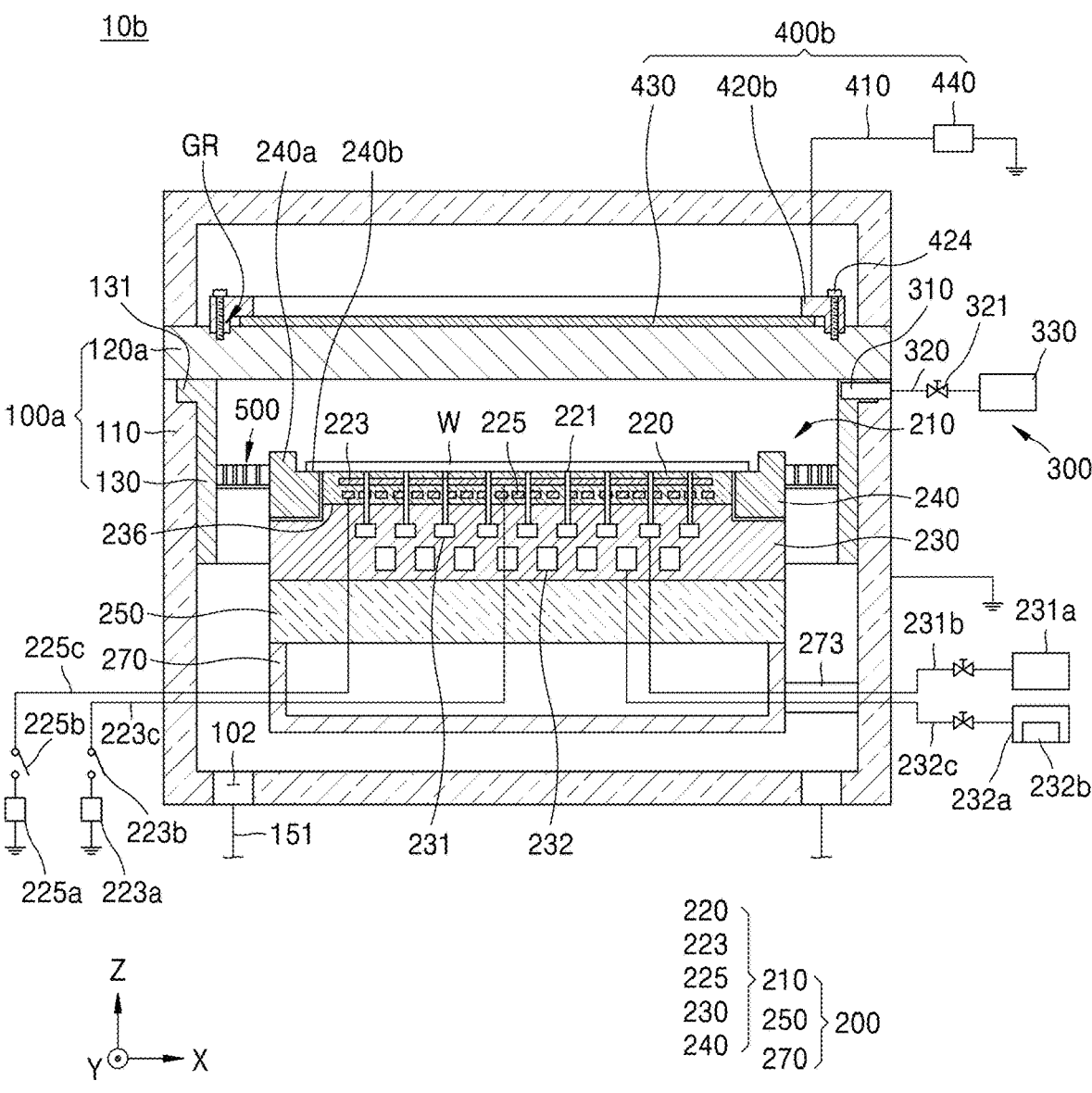
FIG. 5 is a cross-sectional view of a substrate processing apparatus according to an embodiment.

FIG. 5 is a cross-sectional view of a substrate processing apparatus according to an embodiment.

Figure 6:
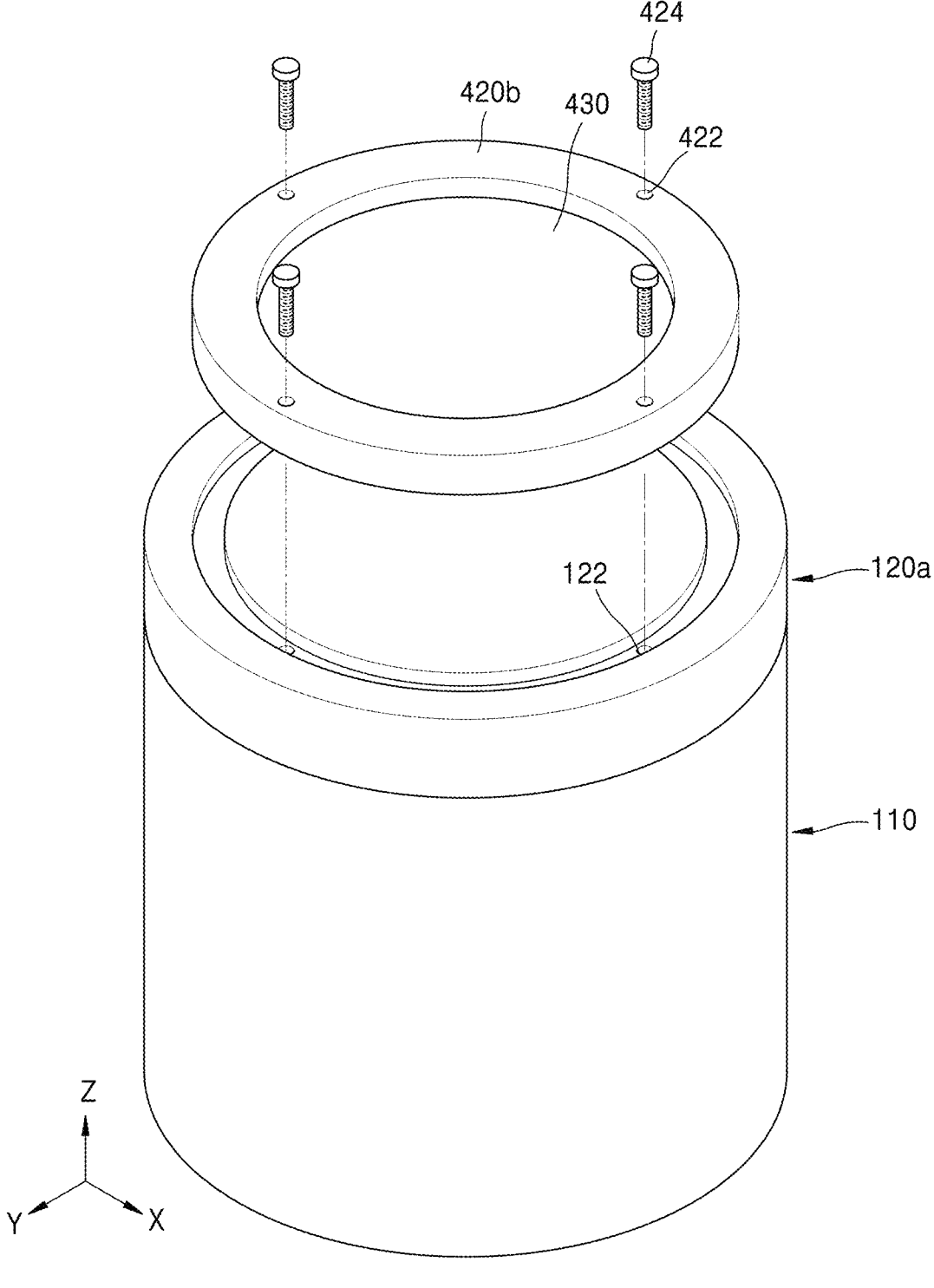
FIG. 6 is a perspective view of a substrate processing apparatus according to an embodiment.

FIG. 6 is a perspective view of a substrate processing apparatus according to an embodiment.

Referring to FIGS. 5 and 6, a substrate processing apparatus 10b includes the chamber 100a, the support unit 200, the gabs supply unit 300, an RF source 400b, and the baffle unit 500.

The support unit 200, the gas supply unit 300, and the baffle unit 500 of FIG. 5 are substantially the same as the support unit 200, the gas supply unit 300, and the baffle unit 500 of FIG. 1, respectively, and thus, only the chamber 100a and the RF source 400b will be described in the following description.

An RF plate 420b may be provided in a ring shape. A slot hole 422 may be formed in an edge of the RF plate 420b and may be fixed to a fastening hole 122 formed in the dielectric window 120 by a coupling unit 424. Therefore, the RF plate 420b may be coupled to an upper surface of a dielectric window 120a.

The coupling unit 424 may include, for example, a non-conductive material for electrical insulation of the dielectric window 120a. For example, the coupling unit 424 may include resin. The coupling unit 424 may be, for example, a plastic bolt. When the coupling unit 424 includes a conductive material, RF power may leak from the RF plate 420b to the dielectric window 120a. In other words, when the coupling unit 424 includes a non-conductive material, reliability of the substrate processing apparatus 10b may increase.

A lower surface of the coupling unit 424 may be located at a vertical level less than that of a lowermost surface of the RF plate 420b. In addition, an upper surface of the coupling unit 424 may be located at the same vertical level as that of an upper surface of the RF plate 420b or may be located at a vertical level greater than the upper surface of the RF plate 420b. In addition, in a plan view, the coupling unit 424 may be located inside the groove GR.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus, comprising:
   a chamber defining a processing space therein;
   a dielectric window arranged at an upper portion of the chamber, a lower planar surface of the dielectric window spanning across the upper portion and defining an upper planar surface of the chamber; and
   an RF source disposed on the dielectric window and being configured to supply RF power to generate plasma from gas in the processing space,
   wherein the RF source includes an RF electrode disposed on the dielectric window and an RF plate disposed on the RF electrode,
   the dielectric window defining a groove extending vertically downward from an uppermost surface of the dielectric window, and the RF plate has a ring shape,
   an uppermost surface of the dielectric window being arranged at a same vertical level as a vertical level of a lower surface of the RF electrode, and is arranged at a vertical level greater than a vertical level of a lowermost surface of the RF plate.

2. The substrate processing apparatus of claim 1, wherein a vertically oriented protrusion portion of the RF plate is engaged with the groove, and the lower planar surface spans horizontally across the upper portion.

3. The substrate processing apparatus of claim 1, wherein, in a plan view, each of side surfaces of the RF plate is not aligned with side surfaces of the groove in a vertical direction, and is located inside each of the side surfaces of the groove in a horizontal direction.

4. The substrate processing apparatus of claim 1, wherein the RF electrode includes an optically transparent material.

5. A substrate processing apparatus, comprising:
   a chamber defining a processing space therein;
   a dielectric window arranged at an upper portion of the chamber and being configured to cover an upper surface of the chamber; and
   an RF source disposed on the dielectric window and being configured to supply RF power to generate plasma from gas in the processing space,
   wherein the RF source includes an RF electrode disposed on the dielectric window and an RF plate disposed on the RF electrode,
   the dielectric window including a groove extending vertically downward from an uppermost surface of the dielectric window, and the RF plate has a ring shape,
   wherein an uppermost surface of the dielectric window is arranged at a same vertical level as a vertical level of a lower surface of the RF electrode, and is arranged at a vertical level greater than a vertical level of a lowermost surface of the RF plate.

6. A substrate processing apparatus, comprising:
   a chamber defining a processing space therein;

a dielectric window arranged at an upper portion of the chamber and being configured to cover an upper surface of the chamber; and an RF source disposed on the dielectric window and being configured to supply RF power to generate plasma from gas in the processing space, wherein the RF source includes an RF power source configured to generate the RF power, an RF electrode disposed on the dielectric window, and an RF plate disposed on the RF electrode, the RF plate including a trench being defined to extend vertically upward from a surface where the RF plate and the RF electrode are in contact with each other; and a gasket arranged inside the trench, the dielectric window defining a groove extending vertically downward from an uppermost surface of the dielectric window, a protrusion portion of the RF plate being engaged with the groove, the RF electrode including an optically transparent material, and the RF plate having a ring shape.

7. The substrate processing apparatus of claim 6, wherein an uppermost surface of the gasket is in direct contact with an uppermost surface of an uneven surface of the RF plate, and a lowermost surface of the gasket is in direct contact with an upper surface of the RF electrode.

8. The substrate processing apparatus of claim 6, wherein an upper surface of the RF electrode is in contact with a lower surface of the trench, and a lower surface of the RF electrode is in contact with the upper surface of the dielectric window.

9. The substrate processing apparatus of claim 6, wherein the RF plate defines a hole, the RF plate further including a coupling arranged inside the hole to fix the RF plate and the dielectric window together.

10. The substrate processing apparatus of claim 9, wherein a lower surface of the coupling is arranged at a vertical level less than a vertical level of a lowermost surface of the RF plate, and in a plan view, the coupling is arranged inside the groove.

11. The substrate processing apparatus of claim 9, wherein the coupling includes a non-conductive material for electrical insulation of the dielectric window.

12. The substrate processing apparatus of claim 6, wherein the gasket includes a conductive material for electrical connection between the RF electrode and the RF plate.

13. The substrate processing apparatus of claim 6, wherein the gasket is elastically compressed.

14. The substrate processing apparatus of claim 6, wherein a major axis of a vertical cross-section of the gasket is parallel to a horizontal direction, and a minor axis of a vertical cross-section of the gasket is parallel to a vertical direction.

\* \* \* \* \*